United States Patent [19]

Nagumo et al.

[11] Patent Number: 4,853,743
[45] Date of Patent: Aug. 1, 1989

[54] MOISTURE-CONTROLLED IMAGE RECORDING APPARATUS

[75] Inventors: Akihiko Nagumo; Shigeru Yoshino, both of Kanagawa, Japan

[73] Assignee: Fuji Photo Film Co., Ltd., Kanagawa, Japan

[21] Appl. No.: 181,349

[22] Filed: Apr. 14, 1988

[30] Foreign Application Priority Data

Apr. 17, 1987 [JP] Japan .................................. 62-93381

[51] Int. Cl.[4] ........................ G03B 27/32; G03B 27/52
[52] U.S. Cl. ...................................... 355/27; 250/319; 355/30; 430/353
[58] Field of Search ............................ 355/27, 28, 30; 250/317.1, 318, 319; 430/353, 350, 570

[56] References Cited

U.S. PATENT DOCUMENTS

| | | | |
|---|---|---|---|
| 4,002,479 | 1/1977 | Suzuki et al. | 430/570 X |
| 4,066,460 | 1/1978 | Chang et al. | 430/350 |
| 4,106,939 | 8/1978 | Chang et al. | 430/353 |
| 4,681,423 | 7/1987 | Nishijima | 355/30 X |
| 4,704,348 | 11/1987 | Koizumi et al. | 355/30 X |
| 4,737,822 | 4/1988 | Taniguchi et al. | 355/27 |
| 4,760,426 | 7/1988 | Taniguchi et al. | 355/27 |
| 4,799,085 | 1/1989 | Nagumo et al. | 355/27 |
| 4,800,275 | 1/1989 | Shimizu et al. | 250/317.1 |

Primary Examiner—Richard A. Wintercorn
Attorney, Agent, or Firm—Sughrue, Mion, Zinn, Macpeak & Seas

[57] ABSTRACT

An image recording apparatus in which a latent image formed on a photo-sensitive material by optical exposure is thermally developed. The photo-sensitive material is piled on an image receiving material so that the image developed on the photo-sensitive material is transferred onto the image receiving material. A moisture detecting sensor directly or indirectly detects the moisture content of the photo-sensitive material to output a control signal. In response to the control signal, a preheating roller preheats the photo-sensitive material or a humidifying nozzle is operated to humidify the photo-sensitive material, whereby the moisture content of the photo-sensitive material is maintained at a desired value.

7 Claims, 2 Drawing Sheets

MOISTURE-CONTROLLED IMAGE RECORDING APPARATUS

BACKGROUND OF THE INVENTION

1. Field of the invention

This invention relates to an image recording apparatus in which a latent image is formed on a photo-sensitive material by optical exposure and is then thermally developed. Thereafter, the photo-sensitive material is piled on an image receiving material so that the image developed on the photo-sensitive material is transferred onto the image receiving material.

2. Background of the invention

One example of an image recording apparatus of this type has been disclosed in Japanese Patent Application No. 287492/1985 filed by the present inventor. The apparatus uses a photo-sensitive material which is formed by coating a support with at least a photo-sensitive silver halogenide, a reducing agent, a polymerizing compound and a color image forming material. At least, the polymerizing compound and the color image forming material are together contained in microcapsules. A latent image is formed on the photo-sensitive material by optical exposure. In the region of the latent image, the polymerizing compound is polymerized to produce therefrom a macromolecular compound, which thereby hardens the microcapsules. Thereafter, the photo-sensitive material is piled on an image receiving material having an image receiving layer onto which the color image forming material can be transferred. The photo-sensitive material and the image receiving material, which have been piled one on another, are pressed together so that, in the remaining region where the latent image is not present, the microcapsules are at least partially broken to cause the color image forming material to transfer onto the image receiving material. Thereby, the desired image is formed on the image receiving material.

In the thermal developing section of the image recording apparatus, the photo-sensitive material is held between and thereby heated by a heating drum and an endless belt in contact with the cylindrical outer wall of the heating drum. As the photo-sensitive material is heated in the above-described manner, the moisture in the photo-sensitive material is heated and thereby evaporated. The resultant steam is trapped in the photo-sensitive material in such a manner that it is more concentrated where the contact pressure between the endless belt and the photo-sensitive material and that between the photo-sensitive material and the heating drum are lower. That is, the distribution of vapor in the photo-sensitive material becomes non-uniform. As the steam comes out of the photo-sensitive material with the non-uniform distribution of vapor, the photo-sensitive material contracts gradually and differentially, thus being creased.

In the photo-sensitive material, the moisture acts to accelerate developing. Therefore, if water (or steam) is non-uniformly distributed over the surface of the photo-sensitive material, then the image is non-uniformly developed.

The above-described difficulties have been eliminated by an image recording apparatus disclosed in Japanese Patent Application No. 298632/1986 filed by the present inventor. In this apparatus, the photo-sensitive material is preheated before reaching the thermal developing section so that moisture is thereby removed from the photo-sensitive material.

On the other hand, in order that the photo-sensitive material may be processed in its entirety at a constant thermal developing speed, it is preferable that a certain small amount of moisture is uniformly distributed over the photo-sensitive material. However, in the invention of Japanese Patent Application No. 298632/1986, the photo-sensitive material is merely preheated to a certain degree, and it is very difficult to adjust the amount of moisture in the photo-sensitive material.

SUMMARY OF THE INVENTION

Accordingly, an object of this invention is to provide an image recording apparatus in which the moisture content in a photo-sensitive material can be so controlled that the resultant image has uniform density and the thermal developing operation can be accelerated.

The foregoing object and other objects of the invention has been achieved by an image recording apparatus in which a latent image formed on a photo-sensitive material by optical exposure is thermally developed. The photo-sensitive material is then piled on an image receiving material so that the developed image in the photo-sensitive material is transferred onto the image receiving material According to the invention, the image recording apparatus comprises control means for measuring the moisture content of the photo-sensitive material, which control means outputs a control signal. The apparatus further includes preheating means provided upstream of a thermal developing station for preheating the photo-sensitive material in response to the control signal outputted by the control means.

In another embodiment of the image recording apparatus of the invention, the photo-sensitive material moisture content measurement control means controls the preheating means or humidifying means, to thereby maintain the moisture content of the photo-sensitive material at a desired value.

The technical concept of the invention is applicable not only to the above-described image recording apparatus, but also to an image recording apparatus in which mobile coloring matter is thermally discharged in conformity with an image and is transferred onto a coloring-matter fixing material containing mordant. The transferring is assisted by a solvent such as water. The concept is also applicable to an image recording apparatus in which the coloring matter is transferred onto the coloring-matter fixing material with the aid of hydrophilic thermal solvent contained in the coloring-matter fixer. That is, the technical concept of the invention is applicable to any image recording apparatus which employs a photo-sensitive material which contain a controlled amount of moisture before being heated. It is especially applicable to an image recording apparatus having a heating section in which the photo-sensitive material is heated while being held between a heating drum and an endless belt. The nature, principle and utility of the invention will become more apparent from the following detailed description when read in conjunction with the accompanying drawings.

DETAILED DESCRIPTION OF THE PREFERRED EMBODIMENTS

Preferred embodiments of this invention will be described with reference to the case where a photo-sensitive material is used which is thermally developed before being pressured image transfer.

Figure 1:
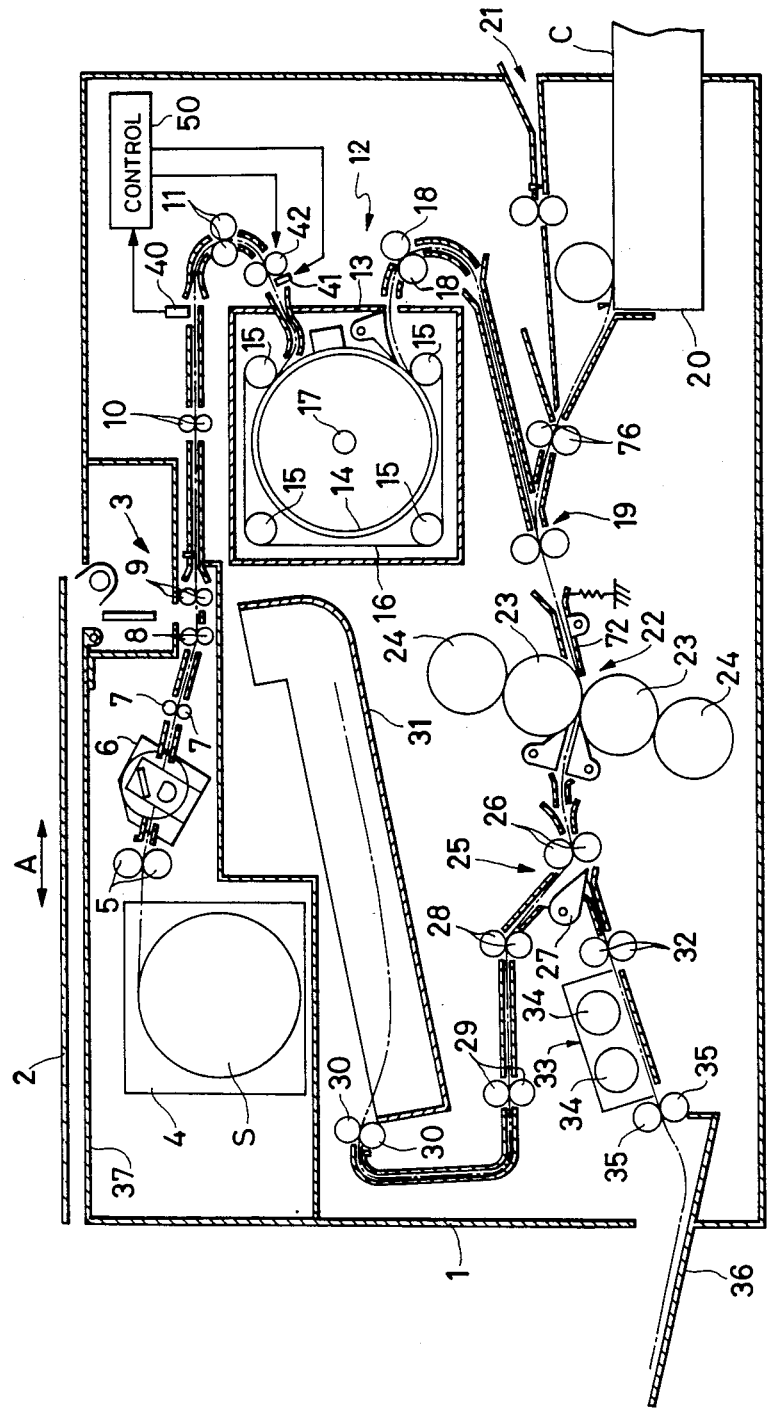
FIG. 1 is a sectional view showing one example of an image recording apparatus according to this invention.

One example of an image recording apparatus according to the invention, as shown in FIG. 1 includes a housing 1 and a transparent glass plate 2 provided on the top of the housing 1 for supporting an original. An exposure unit is provided below the glass plate 2 and is fixed inside the housing 1. The glass plate 2 is reciprocally moved horizontally, as indicated by the arrow A, by unillustrated drive means.

A photo-sensitive material S wound in the form of a roll is loaded in a magazine 4 and is pulled out by means of a pair of supply rollers 5. An upper cover 37 is swung about its right edge when the magazine 4 is to be loaded in the housing 1 or unloaded therefrom. The photo-sensitive material S thus pulled out of the magazine 4 is conveyed to an exposure station by means of conveying rollers 7, 8 and 9 where it is cut to a fixed length by a cutter 6 while being optically exposed to form a latent image thereon.

The cut photo-sensitive material S is then delivered to a thermal developing unit 12 by means of conveying rollers 10 and 11.

A humidity detecting sensor 40 is disposed between the conveying rollers 10 and 11. A pair of preheating rollers 42 and a humidifying nozzle 41 are arranged downstream of the conveying rollers 11, as viewed in the direction of movement of the photo-sensitive material S, in order to adjust the moisture content of the photo-sensitive material S.

The thermal developing unit 12 includes a heat-insulated housing 13, a hollow cylindrically shaped heating roller 14, and four belt supporting rollers 15. An endless belt 16 is laid over the four belt supporting rollers 15 and wound around about 240° the heating roller 14. These rollers 14 and 15 and the belt 16 are accommodated in the housing 13, In the thus constructed thermal developing unit 12, the photo-sensitive material S is conveyed while being held between the belt 16 and the roller 14. As a result, it is heated to a temperature of about 120° C. by a halogen lamp 17 provided inside the heating roller 14.

The photo-sensitive material S thus thermally developed is moved out of the housing 13 of the thermal developing unit 12 and is delivered to a sheet piling station 19, where it is piled on an image receiving sheet C which is supplied alternatively from an image-receiving-sheet cassette 20 or from a manual sheet supplying station 21. The photo-sensitive sheet S and the image receiving sheet C thus piled on one another are conveyed to a pressure-operated image transferring unit 22.

The image transferring unit 22 includes a pair of pressurizing rollers 23 and backup rollers 24 held in contact with the respective pressurizing rollers 23. A blade 72 at the entrance to the image transferring unit 22 prevents the photo-sensitive material S and the image receiving sheet C from being creased. The blade 72 hs one edge elastically pressed against the pressurizing roller 23. The photo-sensitive material S and the image receiving sheet C are pressed at a pressure of about 550 kg/cm$^2$ so that the image recorded on the photo-sensitive material S is transferred onto the image receiving sheet C. Thereafter, the photo-sensitive material S and the image receiving sheet C are delivered to a sheet separator 25.

The sheet separator 25 comprises a pair of conveying rollers 26 and a sheet separating pawl 27 provided downstream of the rollers 26. The pawl 27 is swung to enter the gap between the photo-sensitive material S and the image receiving sheet C to separate them from each other.

The photo-sensitive material S which is separated from the image receiving sheet C by the sheet separator 25 is delivered into a disposal tray 31 by means of conveying rollers 28, 29 and 30. On the other hand, the image receiving sheet C onto which the image has been transferred and which has been separated from the photo-sensitive material S is conveyed to an image fixing unit 33 by means of a pair of conveying rollers 32. In the image fixing unit 33, an ultraviolet lamp 34 irradiates ultraviolet rays on the image receiving sheet C to fix the image. The thus fixed image receiving sheet C is conveyed to a take-out tray 36 by means of a pair of conveying rollers 35.

The above-described humidity detecting sensor 40, forming a measurement section in a photo-sensitive material moisture content measurement control device, outputs a signal corresponding to the humidity inside the housing 1, especially the humidity around the photo-sensitive material conveying path along which the photo-sensitive material S is conveyed to the thermal developing unit 12. The output signal from the humidity sensor 40 is supplied to a control section in the moisture content measurement control device 50 where the moisture content of the photo-sensitive material S corresponding to the detected humidity is determined by a look-up table. Then in the control section, the moisture content thus determined is compared with a predetermined correct developing moisture content. According to the difference therebetween, a preheating temperature to be applied to the photo-sensitive material S by the preheating rollers 42 or the degree of humidification to be given to the material S by the humidifying nozzle 41 is determined. As a result, prior to the thermal developing operation, the moisture content of the photo-sensitive material S is adjusted.

The distribution of humidity in the housing 1 is uniform. Therefore, the humidity detecting sensor 40 can be installed at any position in the housing 1 at which the humidity is not affected by the humidifying nozzle 41.

In another example of the image recording apparatus, instead of the above-described humidity detecting sensor, a moisture content detecting sensor for directly detecting the moisture content of a photo-sensitive material S is used. In the control section of the moisture content measurement control device, the output of the moisture content detecting sensor is compared with a predetermined correct developing moisture content, and according to the difference therebetween the preheating temperature applied to the photo-sensitive material S by the preheating rollers 42 or the degree of humidification given to the material S by the humidifying nozzle 41 is determined, so that the moisture content of the photo-sensitive material is adjusted before the thermal developing operation.

It is desirable that the moisture content measuring position is close to the position at which the moisture content is adjusted if the moisture content measuring operation and the moisture content adjusting operation are not adversely affected. Therefore, it is preferable that the moisture content detecting sensor is provided near the position of the humidity detecting sensor 40 illustrated in FIG. 1.

Figure 2:
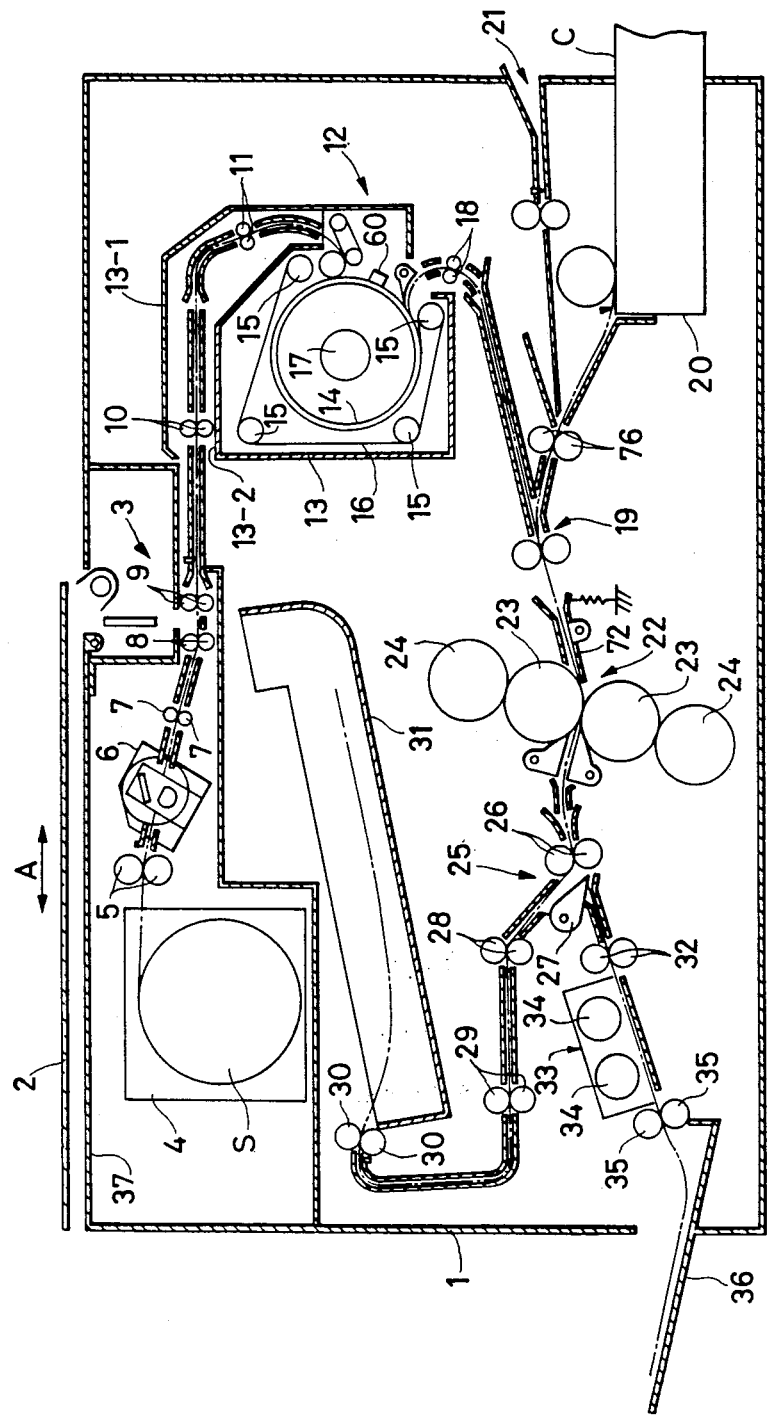
FIG. 2 is a sectional view showing another example of the image recording apparatus according to the invention.

A third example of the image recording apparatus according to the invention is as shown in FIG. 2 in which parts corresponding functionally to those already described with reference to FIG. 1 are designated by corresponding reference numerals.

In the image recording apparatus of FIG. 2, the photo-sensitive material S is exposed in the same manner as in the apparatus of FIG. 1. The part of the path along which the photo-sensitive material is conveyed between the conveying rolls 10 and 11 is surrounded with a heat insulating wall 13-2 and by an upper wall portion 13-1 of the thermal developing unit 12 so that heat radiated by the thermal developing unit 12 is utilized to preheat the photo-sensitive material S. That is, in the apparatus of FIG. 2, the photo-sensitive material S can be preheated without using a heating device.

The photo-sensitive material S thus preheated is processed in the same manner as in the apparatus of FIG. 1 in order to record the image.

As is apparent from the above description, in the image recording apparatus of the invention, the device for controlling the moisture content of the photo-sensitive material including the moisture content measuring section and the control section controls the preheating or the humidifying of the photo-sensitive material so that the moisture content of the photo-sensitive material is left constant and uniform. As a result, with the apparatus of the invention, the thermal development is accelerated, and the difficulty that the resultant image is uneven is eliminated.

What is claimed is:

1. An image recording apparatus comprising:
   means for optically exposing a photo-sensitive material to thereby form a latent image in said photo-sensitive material;
   a thermal developing means for thermally developing said latent image in said photo-sensitive material to thereby form a developed image therein:
   means for conveying said photo-sensitive material along a path from said exposing means to said thermal developer:
   means for piling said photo-sensitive material having said developed image therein on an image receiving material and for transferring said developed image to said piled image receiving material:
   a housing containing said conveying means and said thermal developing means;
   moisture measuring means disposed inside said housing for measuring a moisture and producing a control signal; and
   preheating means provided along said path upstream of said thermal developing means for preheating said photo-sensitive material in response to said control signal.

2. An apparatus as claimed in claim 1, further comprising humidifying means disposed upstream of said thermal developing means along said path for humidifying said photo-sensitive material in response to said control signal.

3. An apparatus as claimed in claim 1, wherein said measured moisture is a moisture content of said photo-sensitive material.

4. An apparatus as claimed in claim 1, wherein said measured moisture is a humidity at a point inside said housing and wherein said apparatus further comprises means for comparing a value of said control signal with a predetermined value and outputting a photo-sensitive material moisture content control signal received by said preheating means.

5. An apparatus as claimed in claim 4, wherein said comparing means comprises means for converting said value of said control signal to a photo-sensitive material moisture content and further means for comparing said photo-sensitive material moisture content with a predetermined developing moisture content.

6. An apparatus as claimed in claim 1, wherein said moisture measuring means detects a moisture content of said photo-sensitive material and said apparatus further comprises means for comparing said control signal with a predetermined developing moisture content to provide a photo-sensitive material moisture content control signal received by said preheating means.

7. An image recording apparatus, comprising:
   means for optically exposing a photo-sensitive material to thereby form a latent image in said photo-sensitive material;
   a thermal developer for thermally developing said latent image in said photo-sensitive material to thereby form a developed image therein;
   means for conveying said photo-sensitive material along a path from said exposing means to said thermal developing means;
   means for piling said photo-sensitive material having said developed image therein on an image receiving material and for transferring said developed image to said piled image receiving material;
   a housing containing said conveying means and said thermal developing means;
   moisture measuring means disposed inside said housing for measuring a moisture and producing a control signal; and
   humidifying means disposed upstream of said thermal developing means along said path for humidifying said photo-sensitive material in response to said control signal.

* * * * *